United States Patent [19]

Lee

[11] Patent Number: 5,796,853
[45] Date of Patent: Aug. 18, 1998

[54] SPEAKER AND AMPLIFIER SYSTEM

[75] Inventor: Noel Lee, South San Francisco, Calif.

[73] Assignee: Monster Cable Internation, Ltd., South San Francisco, Calif.

[21] Appl. No.: 167,411

[22] Filed: Dec. 15, 1993

[51] Int. Cl.$^6$ .................................................. H04B 15/00
[52] U.S. Cl. ...................... 381/120; 381/94.1; 381/94.6
[58] Field of Search ................................. 381/77, 28, 94, 381/120, 94.1, 94.7, 94.9, 71.1, 71.7, 59, 74, 96

[56] References Cited

U.S. PATENT DOCUMENTS

| | | | |
|---|---|---|---|
| 4,718,100 | 1/1988 | Brisson | 381/77 |
| 5,033,091 | 7/1991 | Bond | 381/77 |
| 5,099,518 | 3/1992 | Lindsay et al. | 381/97 |
| 5,123,052 | 6/1992 | Brisson | 381/77 |

FOREIGN PATENT DOCUMENTS

| | | | |
|---|---|---|---|
| 2464613 | 4/1981 | France | 381/120 |
| 61-210752A | 9/1986 | Japan | 381/77 |

OTHER PUBLICATIONS

*Audio Cyclopedia* by Howard M. Tremaine; 1973 p. 1651.
*Physics* by Hans Ohanian; 1985 pp. 727–729.

*Primary Examiner*—Thomas D. Lee
*Assistant Examiner*—Jerome Grant, II
*Attorney, Agent, or Firm*—Haynes and Boone, L.L.P.

[57] ABSTRACT

A high fidelity system is provided that employs a speaker and amplifier arrangement. The amplifier is separated into a pre-amplifier and at least one audio current amplifier sections. The connections between the pre-amplifier and the audio current amplifiers are much longer than the connections between the audio current amplifier and the loud speakers. The audio current amplifier may be mounted directly on the frame of the speaker, externally thereof.

2 Claims, 2 Drawing Sheets

SPEAKER AND AMPLIFIER SYSTEM

BACKGROUND OF THE INVENTION

1. Field of the Invention

The present invention relates to a system including a speaker and amplifier, and more particularly to such a system including connections between the signal source, amplifier and speaker.

2. Background of the Invention

In high fidelity stores, voltage amplifiers and audio current amplifiers are generally sold either as a combined unit, or as separate units. In conventional high fidelity systems, the voltage amplifier and audio current amplifier are generally closely connected to one another (particularly, of course, when they are parts of a single unit) and the voltage amplifier is closely coupled to a signal source such as a CD player. In order to position the speakers at the desired location however, the amplifiers are usually remotely coupled to loudspeakers via speaker cables. That is, the loudspeakers are usually located far away from both amplifiers, for example 25 feet or more. However, in a few instances where space provides, combined voltage amplifiers and current amplifiers may be closely coupled to the speakers and remotely coupled to the signal source. Thus, the voltage amplifiers and current amplifiers are conventionally connected closely to one another.

The transmission of audio power frequency signals from the current amplifier to the loudspeaker via speaker cables, however, results in the introduction of distortion. In such high fidelity systems since the signal between the current amplifier and the speaker is low, i.e., high current at low voltage, distortion occurs. That is, in systems which employ standard cables that include two wires, distortion and losses occur, due, for example, to self inductance and resistance. Self inductance is a product of interacting magnetic fields caused by signals in one wire inducing an undesirable signal of opposite polarity in the other wire. Such spurious signals are applied to the amplifier which causes distortion and general degradation of the audio power signal.

Other distortions include hum and electromagnetic interference from other sources, and these distortions are increased in systems that require extremely long interconnect cables. Further, proper impedance matching between a loudspeaker and a cable is difficult to obtain with standard cable wires. Additional distortion arises as a result of the use of an active amplifier as a voltage amplifier. A typical characteristic impedance of a standard wire is 100 ohms whereas a loudspeaker typically has an impedance of 4 to 16 ohms over the audio power frequency range. Such cable-loudspeaker impedance mismatch causes inefficient transfer of power and reflection back to the current amplifier, and such reflections often result in instability and distortion in the current amplifier.

In order to overcome distortion in the prior systems, it has frequently been necessary to provide negative feedback loops. While such negative feedback reduces distortion, it undesirably also increases transient intermodulation as well as group delay. Since additional components generally introduce additional complications, amplifier systems including means for correcting such problems can become quite complex.

FIG. 1, is a block diagram of one possible configuration of a high fidelity system. In this system, signal source 10 such as a CD player is coupled to a voltage amplifier 14 by wire conductors 12 to supply a source signal to amplifier 14. Amplifier 14 consists of two sections or stages. The first stage is a voltage amplifier 16, i.e. an active voltage amplifier, and is connected directly to the signal source 10. The second stage is an audio current amplifier 20, i.e. an active current amplifier, and is coupled to the voltage amplifier 16 and speaker 24 by wire conductors 18 and 22 respectively. Voltage amplifier 16 receives the source signal and functions as a voltage amplifier to significantly amplify the voltage of the signal for audio current amplifier 20 to supply sufficient power, i.e., high current at a low voltage, to drive the loudspeaker 24.

As seen in FIG. 1, the coupling distance (A) between signal source 10 and the voltage amplifier 16 is much greater than the coupling distances (B) or (C), between voltage amplifier 16 and audio current amplifier 20 and audio current amplifier 20 and loudspeaker 24, respectively. In FIG. 2, on the other hand, which illustrates another possible interconnection, the amplifier 14 is closely connected to the signal source 10 by wire conductors 14 and remotely coupled to loudspeaker 24 by wire conductors 22. Voltage amplifier 16 is closely coupled to audio current amplifier 20. Here the distance (C) is much greater than distances (A) and (B). In the system shown in FIG. 1, the conductor 12 generally has a high impedance and carries a very low level signal, and thus is subject to the electromagnetic interference. In the system of FIG. 2, the signal carried by the wire conductor 22 is a high current signal. Consequently, both of these systems are susceptible to hum, interference and other distortions as described above.

In order to avoid the problems of the type described above, speaker cables having large cross sectional areas have been produced. In general such cables use a large quantity of separately insulated small conductors arranged in two sets which are relatively disposed to minimize self inductance and mutual inductance. In such cables, it has been observed however that in some cases unstable conditions may result. For example, the amplifier may enter a state of uncontrolled oscillations. Such oscillations have been observed to cause appreciable distortion in high fidelity systems channels. To alleviate this problem, a loudspeaker-cable interface was developed. See U.S. Pat. No. 4,177,431. Such an interface connects the speaker to the cable attached to the amplifier. The interface includes a capacitor and resistor for terminating the cable with a predetermined impedance at frequencies above the audio power range. According to this patent, the interface operates to inhibit generation of spurious high frequency oscillations which could cause damage to the amplifier.

In one known device, as disclosed in U.S. Pat. No. 4,625,318, a speaker is especially designed to incorporate a current amplifier totally within its frame, in order that air waves produced by the cone serve to cool the heat sink of the amplifier. While such a device reduces the distortions and losses that may occur in the connection between the current amplifier and the speaker, it increases the cost of the combination not only due to the complexity of designing the speaker to include an amplifier, but also due to the fact that separate devices must be produced and stocked for each of the power various ratings and speaker sizes that the consumer may wish to purchase and install. The speaker/amplifier of this reference is especially designed for use in an automobile, i.e. for connection to the output of a conventional automotive sound source. Since the output amplifiers of conventional automotive sound sources are themselves current amplifiers, the interconnecting cables must still be large enough to minimize distortion and power losses.

SUMMARY OF THE INVENTION

It is an object of the present invention to solve the above mentioned disadvantages of amplifier/speaker systems.

Another object of the present invention is to provide a system that decreases the distortion which arises in the cable connection between an amplifier and speaker, and that does not require the use of negative feedback in order to avoid distortion.

In accordance with one embodiment of the invention, the disadvantages described above are solved by the provision of a high fidelity system that employs a speaker and amplifier arrangement wherein the amplifier is separated into a pre-amplifier and at least one audio current amplifier section. The pre-amplifier is coupled to the audio current amplifier via conductors that are much longer than the connections between the audio current amplifier and the speaker.

In another embodiment of the invention, irrespective of the relative distance between the elements of the system, an impedance transformer is provided to match the impedances at the input and output elements of the system to the characteristic impedance of any cable interconnecting current amplifier to previous elements of the system. Such an impedance transformer may constitute a passive device, thereby minimizing noise and distortions that may otherwise arise if an active voltage amplifier had been employed.

In a preferred embodiment the output of the audio current amplifier is connected directly to the speakers, for example by mounting the amplifier externally of the speaker, on the speaker frame itself.

In accordance with an aspect of the invention, a high fidelity system is provided which includes a signal source, an amplifier coupled to said signal source and at least one speaker coupled to said amplifier. The amplifier comprises a first or voltage amplifier section for receiving a signal directly from said signal source and providing a low power signal, and at least one second or current amplifier section coupled to said first section for said speaker. The second section receives the amplified, but low power signal from said first section and outputs a high power signal to the respective speaker. Thus, the first section is generally considered to constitute a voltage amplifier, while the second section constitutes a current amplifier. The second section is connected to the first section by connections that are much longer than the connections between the second section and the speaker, and the connections between the signal source and the first section.

BRIEF DESCRIPTION OF THE DRAWINGS

The invention is illustrated by way of example and not limited by the figures of the accompanying drawings in which like references denote like or corresponding parts, and in which.

DETAILED DESCRIPTION OF THE PREFERRED EMBODIMENT

Figure 1:
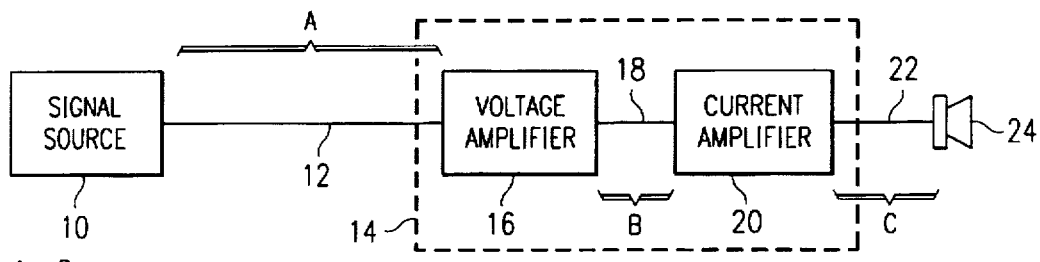
FIG. 1 is a block diagram of a high fidelity system that may be subject to distortion and losses.
Figure 2:
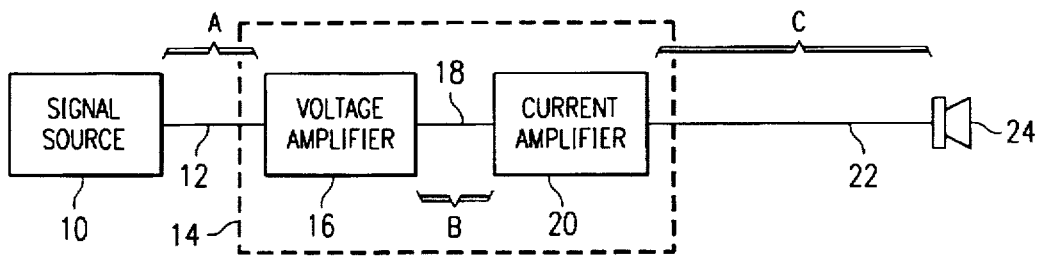
FIG. 2 is block diagram of another high fidelity system that may be subject to distortion and losses.
Figure 3:
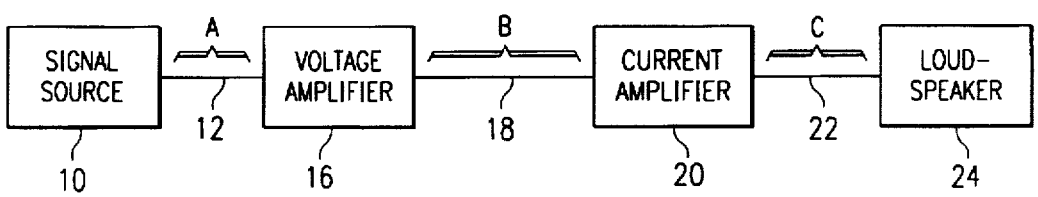
FIG. 3 is a block diagram of an amplifier and speaker arrangement according to the present invention.

Referring now to the block diagram of FIG. 3, in accordance with the invention, an amplifier/speaker system is provided that includes a voltage amplifier 16 and audio current amplifier 20. The voltage amplifier 16 and current amplifier 20 are remotely coupled by wire conductors 18 having a length (B). Audio current amplifier 20 is closely connected to loudspeaker 24 by wire conductors 22 having length (C). According to the present invention, the length (B) is much greater than the length (C). It is understood herein that reference to one distance or length as being "much greater" or "much longer" than a second distance or length refers to the first distance or length being at least 10 times the second distance or length.

By decreasing the length of wire conductor 22, i.e., distance (C), any distortion, hum, or signal losses etc., may be substantially reduced or eliminated.

Figure 4:
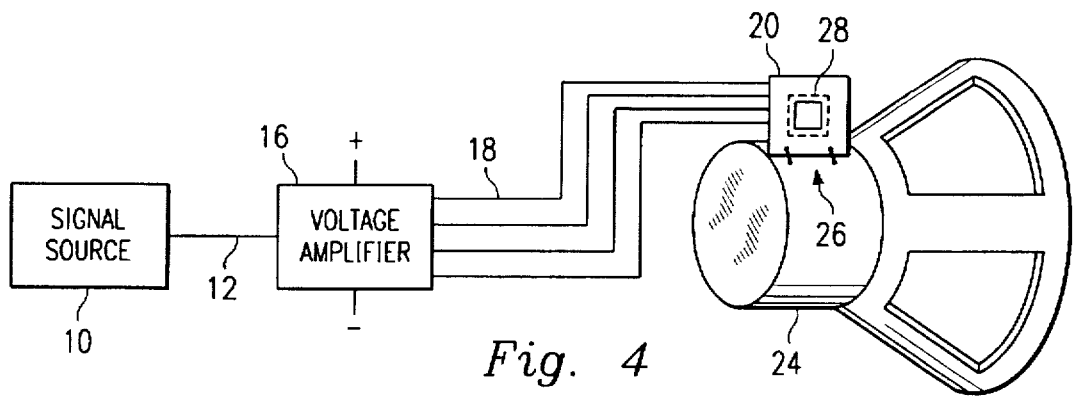
FIG. 4 illustrates a combined audio current amplifier and speaker structure in accordance with the present invention.

In the embodiment of the invention illustrated in FIG. 4, audio current amplifier 20 is mounted directly on the speaker itself, externally of the frame thereof, and connected directly to terminals 26 of the speaker 24. Alternatively, the current amplifier 20 may be mounted closely adjacent the speaker, for example on a common support (not shown). In this arrangement the wire conductor 22 may have a minimum or effectively zero length (i.e. length (C)=0). Audio current amplifier 20 is shown with conventional electrical components 28. In this arrangement, distortion, losses and interference are substantially entirely eliminated.

Figure 5:
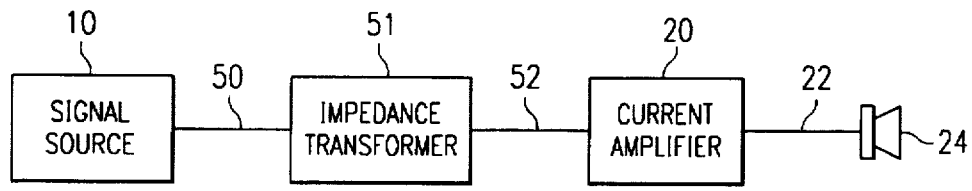
FIG. 5 is a block diagram of a further high fidelity system in accordance with the invention.
Figure 6:
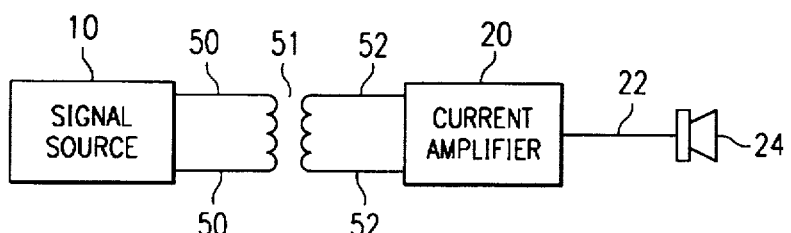
FIG. 6 illustrates a modification of the system of FIG. 5.

In the further embodiment of the invention, as illustrated in FIG. 5, the signal source 10 is coupled via cable 50 to an impedance transformer 51, and the impedance transformer 51 is coupled to the current amplifier 20 via a cable 52. The impedance transformer 51 serves to match the impedances of the signal source 10 and the current amplifier 20 to the characteristic impedance of the cable 52, in order to minimize signal losses and distortion. As illustrated in FIG. 6, the impedance transformer may be a passive device such as transformer with the turns of the primary and secondary winding being select to match the impedances of the source and the current amplifier to the characteristic impedance of the cable. Since the transformer is a passive device, this arrangement provides a substantial reduction in noise and distortion that arises in the front end of the system. Thus, the impedance transformer does not have non-linear characteristics, and does not require negative feedback. All distortions attributable to an active preamplification stage can thereby be eliminated, the S/N ratio is improved, and the impedance transformer has a wide dynamic range. The impedance matching transformer may be considered to constitute a voltage amplifier.

Figure 7:
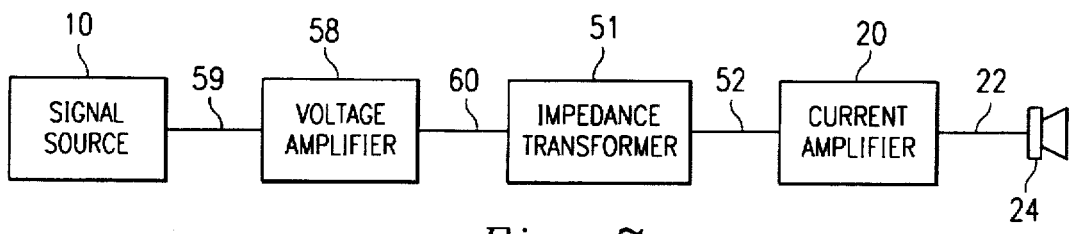
FIG. 7 illustrates a further modification of the system of FIG. 5.

In a further modification of the system of FIG. 5, as illustrated in FIG. 7, the output of the signal source 10 is applied to a voltage amplifier 58 via a cable 59, and the output of the voltage amplifier 58 is applied to the impedance transformer 51 via a cable 60. This arrangement provides the advantage that the voltage amplifier may provide voltage gain in order to decrease the sensitivity of the interconnecting cables to external fields, while retaining the advantages of the use of an impedance transformer. The voltage gain of the voltage amplifier may be reduced in order to reduce the generation of thermal noise.

In the arrangements of FIGS. 5, 6 and 7, since the impedance transformer to take into consideration the parameters of the cable between the impedance transformer and the current amplifier, the cable effectively constitutes a component of the amplifier system, per se. The impedance transformer is selected to provide as high a voltage as possible on the interconnecting cable, in order to further minimize distortion and interfering noise signals.

The arrangement of the present invention, as disclosed above, thereby provides a system that overcomes problems of known systems, such as distortion, without requiring such expedients as negative feedback.

In accordance with the invention, the speaker and/or amplifier may be conventional commercially available devices, thereby reducing the cost of the system.

While the invention has been described specifically with reference to single elements, such as a source, an amplifier and a speaker, it is apparent that the system may include a plurality of such elements, such as, for example, for a stereo system.

Although the invention has been described with reference to preferred embodiments, it will be apparent to one skilled in the art that variations and modifications are contemplated within the spirit and scope of the invention. The drawings and description of the preferred embodiments are made by way of example rather than to limit the scope of the invention, and it is intended to cover within the spirit and scope of the invention all such changes and modifications.

I claim:

1. A high fidelity system comprising a signal source; a speaker comprising terminal means and a frame; and an amplifier coupled to said signal source and to said speaker, said amplifier comprising: a first section connected to said signal source via first conductors, said first section receiving source signal from said signal source and amplifying the voltage thereof; a second section mounted directly on the external surface of said speaker frame for minimizing the length of a third conductor; said second section being connected to said first section via second conductors and being connected to said terminal means of said speaker via third conductors, said second section receiving the output of said first section, amplifying the current thereof, and applying a current amplified power output signal to said speaker, said third conductors being much shorter than said second conductors; said speaker contains a terminal means for connecting the third connector.

2. A high fidelity system including a signal source, a voltage amplifier, first conductors connecting said signal source to said voltage amplifier, whereby said voltage amplifier receives signals from said source and amplifies them to provide amplified output signals; a current amplifier, second conductors connecting said current amplifier to said first amplifier, whereby said current amplifier receives said amplified output signals and applies them to provide a power output signal; a speaker; and third conductors connecting said speaker to said current amplifier, whereby said speaker receives said power output signal; said second conductors being much longer than either of said first and third conductors, whereby signal losses and distortion of signals applied to said speaker are reduced; said speaker having a frame with an external surface; and said current amplifier is mounted directly on said external surface.

* * * * *